(12) United States Patent
Komyo

(10) Patent No.: US 7,180,326 B2
(45) Date of Patent: Feb. 20, 2007

(54) NOISE ELIMINATION CIRCUIT

(75) Inventor: Masayasu Komyo, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 95 days.

(21) Appl. No.: 10/998,838

(22) Filed: Nov. 30, 2004

(65) Prior Publication Data

US 2005/0122129 A1    Jun. 9, 2005

(30) Foreign Application Priority Data

Dec. 4, 2003    (JP) ............................. 2003-405939

(51) Int. Cl.
*H03K 17/16* (2006.01)
(52) U.S. Cl. ..................... 326/27; 326/26; 327/551
(58) Field of Classification Search ................ 326/22, 326/23, 24, 26, 27, 82, 83; 327/551, 215
See application file for complete search history.

(56) References Cited

U.S. PATENT DOCUMENTS 4,334,157 A * 6/1982 Ferris ........................ 327/218
4,760,279 A * 7/1988 Saito et al. ................. 327/34
5,019,724 A * 5/1991 McClure ...................... 326/29

FOREIGN PATENT DOCUMENTS

| JP | 06-216723 | 8/1994 |
|----|-----------|--------|
| JP | 10-294652 | 11/1998 |

* cited by examiner

*Primary Examiner*—Daniel Chang
(74) *Attorney, Agent, or Firm*—McGinn IP Law Group, PLLC

(57) ABSTRACT

A noise elimination circuit sets a certain time period for eliminating noise occurring immediately after a change in the logic level of an input signal by a delay time of a first delay buffer. It also adjusts the timing of switching by delay times of second and third delay buffers. The noise elimination circuit thereby blocks the input signal for a certain period of time immediately after the change in the logic level of the input signal to keep a switching signal by a latch circuit or transmit only the same logic level as the input signal to an output.

21 Claims, 4 Drawing Sheets

NOISE ELIMINATION CIRCUIT

BACKGROUND OF THE INVENTION

1. Field of the Invention

The present invention relates to noise elimination circuits and, particularly, to a noise elimination circuit for eliminating the noise inputted immediately after a change in the logic level of an input signal to an integrated circuit.

2. Description of Related Art

In some cases, a narrow-width pulse inputted to an integrated circuit immediately after a change in the logic level of an input signal causes malfunction of the circuit. This noise is switching noise which occurs upon switching of the outputs of an output buffer circuit which sends the input signal or ringing noise. To eliminate such noise, some circuits have a delay circuit with a noise elimination function. These circuits compare the signal having passed through the delay circuit with an original signal, thereby outputting a signal with no noise.

FIG. 5 is a circuit diagram to explain a noise elimination circuit described in Japanese Unexamined Patent Publication No. 06-216723 (Yoshimitsuya et al.). This noise elimination circuit includes a delay circuit, PMOS transistors P1 and P2, NMOS transistors N3 and N4, and a latch circuit. The delay circuit includes inverters 5, 6, and a capacitor C1. The PMOS transistors P1 and P2 are connected in series between a power supply (VDD) and a node d. The NMOS transistors N3 and N4 are connected in series between the node d and a ground (GND). The latch circuit includes inverters 7, 8 and is connected to the node d. An input signal IN is inputted through a node a to the gates of the PMOS transistor P1 and the NMOS transistor N4 and also to the delay circuit, where it is delayed and then inputted to the gates of the PMOS transistor P2 and the NMOS transistor N3. An output signal OUT is outputted through the node d.

FIG. 6 is a timing chart to explain the operation of the noise elimination circuit. It shows a change in voltage at each node. The circuit operation is explained hereinafter with reference to FIG. 6. In the following description, a low logic level of a signal is referred to as "L", and a high logic level as "H". In the time period T1, the signal at the nodes a, b, and c, are "H", "L", and "H", respectively. The PMOS transistors P1 and P2 are both off, and the NMOS transistors N3 and N4 are both on. The signal at the node d is thus "L".

In T2, when the node a changes from "H" to "L", the voltage at the node b increases from "L" to "H" due to the on-resistance of the inverter 5 in the "H" output state and the time constant of the capacitor C1. If the voltage at the node b reaches a logic threshold voltage of the inverter 6, the node c changes from "H" to "L". Since the node a is "L" and the node c is "H" in T2, the PMOS transistor P2 and the NMOS transistor N4 are off. Though the node d thereby becomes in the high impedance state, it remains "L" because of the latch circuit including the inverters 7 and 8.

In T3, the nodes a and c turn to "L". The PMOS transistors P1 and P2 are both on, and the NMOS transistors N3 and N4 are both off. The signal at the node d is thus "H".

In T4, when the node a changes from "L" to "H", the voltage at the node b decreases from "H" to "L" due to the on-resistance of the inverter 5 in the "L" output state and the time constant of the capacitor C1. If the voltage at the node b reaches the logic threshold voltage of the inverter 6, the node c changes from "L" to "H". Since the node a is "H" and the node c is "L" in T4, the PMOS transistor P1 and the NMOS transistor N3 are off. Though the node d thereby becomes in the high impedance state, it remains "H" because of the latch circuit including the inverters 7 and 8. The operation in T5 is the same as that in T1, and the signal at the node d is "L".

As described above, the signal transmission from the node a to the node d is blocked in T2 to T4. It is thereby possible to eliminate a narrow-width noise inputted in these time periods. The time periods T2 and T4 correspond, respectively, to a delay time Td of the delay circuit when the input changes from "H" to "L" and a delay time Td' of the delay circuit when the input changes from "L" to "H".

Yoshimitsuya et al. also teaches a delay circuit including a transistor and a capacitor so as to prevent malfunction due to the sequential input of a plurality of narrow-width noises. Further, Japanese Unexamined Patent Publication No. 10-294652 (Abe) discloses a noise elimination circuit which sets an optimum delay time for each of upward noise and downward noise.

It has now been discovered that the noise elimination circuits taught by Yoshimitsuya et al. and Abe have the problem that a delay time from the input of an input signal to the output of an output signal increases. This is because the circuits compare the signal having passed through the noise elimination circuit with the original signal to determine the output. For example, in the circuit taught by Yoshimitsuya et al., the delay circuit including the inverters 5, 6, and the capacitor C1 serves as a noise elimination circuit, and it determines the output by comparing the signal at the node c having passed through the noise elimination circuit with the original signal at the node a. Thus, the delay times Td and Td' shown in FIG. 6 occur between the input of the input signal IN and the output of the output signal OUT.

SUMMARY OF THE INVENTION

A noise elimination circuit according to one aspect the present invention includes a logic circuit and a latch circuit. The logic circuit includes first to fourth transistors. The first transistor outputs a first logic level to an output node in response to a first direction change in a logic level of an input signal. The second transistor outputs a second logic level to the output node in response to a second direction change in the logic level of the input signal. The third transistor is connected in series to the second transistor and blocks signal output from the second transistor to the output node for a certain period of time after the first direction change in the logic level of the input signal. The fourth transistor is connected in series to the first transistor and blocks signal output from the first transistor to the output node for a certain period of time after the second direction change in the logic level of the input signal. The latch circuit keeps a signal of the output node.

In another aspect, the noise elimination circuit may include first and second logic gates. The first logic gate receives the input signal and an output of a first delay circuit which delays the input signal for the certain period of time. The second logic gate receives the input signal and the output of the first delay circuit. In this circuit, the third transistor blocks signal output from the second transistor to the output node in response to an output of the first logic gate. The fourth transistor blocks signal output from the first transistor to the output node in response to an output of the second logic gate.

The present invention blocks an output having an opposite logic level from an input signal for a certain period of time immediately after a change in the logic level of the input signal so as to transmit only the same logic level as the input signal to the output or keep a signal of the output node constant by the latch circuit. Thus, the noise elimination circuit does not affect the delay of the signal, and the output does not change even when a narrow-width pulse is inputted during a certain time period immediately after a change in the logic level of the input signal. Hence, the noise elimination circuit has no influence on the delay between input and output, and it prevents the noise inputted immediately after a change in the logic level of the input signal from being transmitted to an internal circuit.

The noise elimination circuit of the present invention is capable of eliminating the noise inputted during a certain time period immediately after a change in the logic level of an input signal without affecting the delay between input and output.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
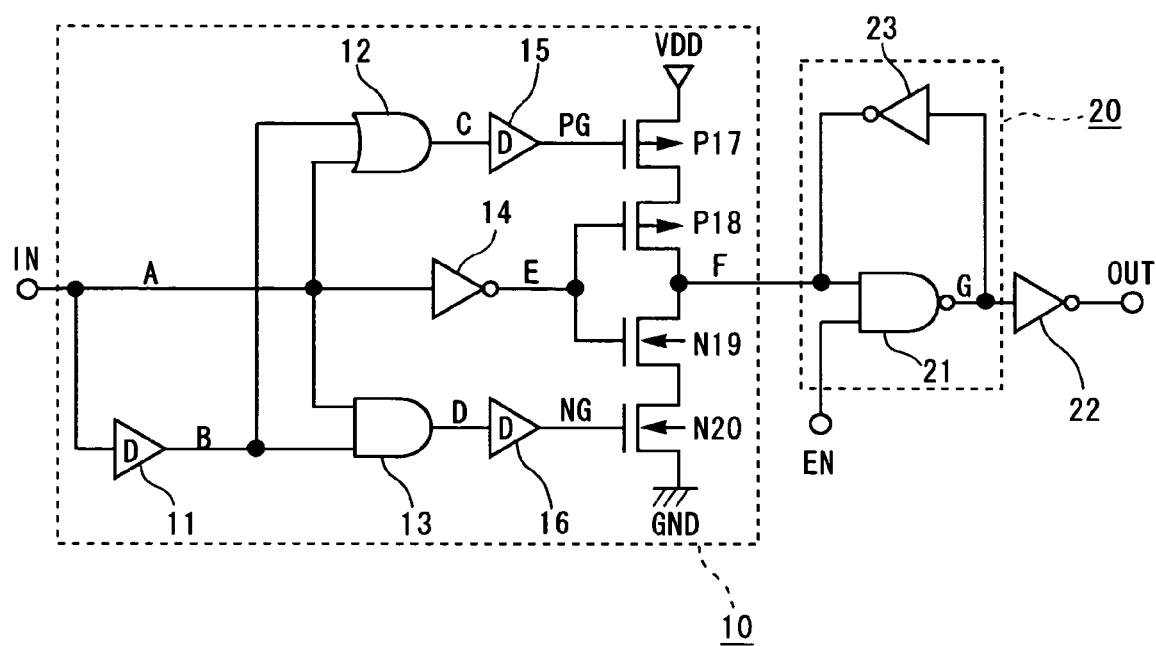
FIG. 1 is a circuit diagram showing the configuration of a noise elimination circuit of one embodiment of the invention.

An embodiment of the present invention is explained hereinafter with reference to the drawings. FIG. 1 is a circuit diagram showing the configuration of a noise elimination circuit of a first embodiment. The noise elimination circuit includes a logic circuit 10, a latch circuit 20, and an inverter 22. The logic circuit 10 includes a delay buffer 11, an OR gate 12, an AND gate 13, an inverter 14, a delay buffer 15, a delay buffer 16, a PMOS transistor P17, a PMOS transistor P18, a NMOS transistor N19, and a NMOS transistor N20. The latch circuit 20 includes a NAND gate 21 and an inverter 23.

The first input of the OR gate 12 is connected to a node A to receive an input signal IN. The second input of the OR gate 12 is connected to a node B, which is the output of the delay buffer 11, to receive an output signal from the delay buffer 11. Similarly, the first input of the AND gate 13 is connected to the node A, and the second input of the AND gate 13 is connected to the node B. The input of the delay buffer 11 is connected to the node A to receive the input signal IN.

The gate electrodes of the PMOS transistor P18 and the NMOS transistor N19 are connected to a node E, which is the output of the inverter 14. The input of the inverter 14 is connected to the node A to receive the input signal IN. The gate electrode of the PMOS transistor P17 is connected to the output of the delay buffer 15 to receive an output signal PG from the delay buffer 15. The input of the delay buffer 15 is connected to a node C, which is the output of the OR gate 12. The gate electrode of the NMOS transistor 20 is connected to the output of the delay buffer 16 to receive an output signal NG from the delay buffer 16. The input of the delay buffer 16 is connected to a node D, which is the output of the AND gate 13 to receive an output signal from the AND gate 13. The source electrode of the PMOS transistor P17 is connected to a first power supply (VDD), and the source electrode of the NMOS transistor N20 is connected to a second power supply (GND). The drain electrode of the PMOS transistor P17 is connected to the source electrode of the PMOS transistor P18.

The drain electrode of the NMOS transistor N20 is connected to the source electrode of the NMOS transistor N19. The drain electrodes of the PMOS transistor P18 and the NMOS transistor N19 and the output of the inverter 23 are connected to a node F, which is the output node of the logic circuit 10. One input of the NAND gate 21 is connected to the node F, and another input receives an enable signal EN. The inputs of the inverters 22 and 23 are connected to a node G, which is the output of the NAND gate 21. An output signal OUT of the noise elimination circuit is outputted from the inverter 22. Though not shown in FIG. 1, the input signal IN is a signal inputted through an external input terminal of an integrated circuit or an output signal from an internal circuit of an integrated circuit. The output of the inverter 22 is connected to an internal circuit or an output buffer of an integrated circuit to supply the output signal OUT thereto.

The delay buffers 11, 15, and 16 delay a signal. The buffer may include a circuit for delaying the output of an inputted signal, and a circuit for maintaining a constant delay time regardless of semiconductor manufacturing fluctuation, drive voltage, and ambient temperature. The buffer may be composed of multistage inverter, multistage buffer, resistor, capacitor, and so on.

Figure 2:
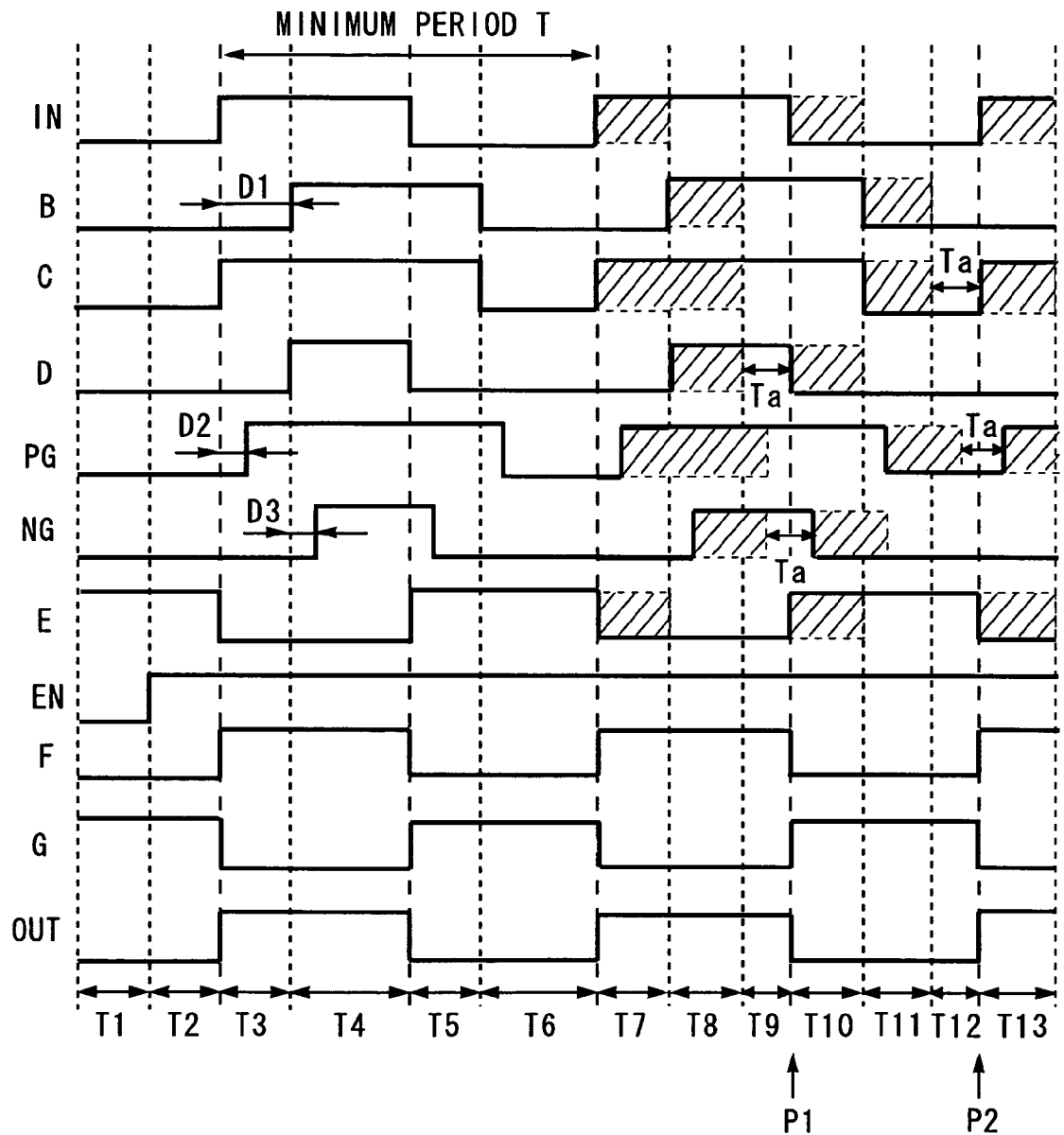
FIG. 2 is a timing chart to explain the operation of the noise elimination circuit of FIG. 1.

Referring next to FIG. 2, the operation of the noise elimination circuit of FIG. 1 is explained. FIG. 2 is a timing chart to explain the operation of the noise elimination circuit of FIG. 1. It shows a change in the voltage of the input signal IN, the output signal PG of the delay buffer 15, the output signal NG of the delay buffer 16, signals at the nodes B to G, and the output signal OUT. Also in the description of the timing chart, a low logic level of a signal is "L", and a high logic level is "H". The delay times of the delay buffer 11, 15, and 16 are D1, D2, and D3, respectively.

The noise elimination circuit eliminates the noise occurring during the delay time D1 immediately after a change in the logic level of the input signal IN. To explain this, the region where a signal is "H" or "L" for a certain period of time immediately after a change in the logic level of the input signal IN in FIG. 2 is referred to as a noise region. The time period of the noise region is set equal to the delay time D1. The delay time D1 should be less than one-fourth of a minimum period T of the input signal of the noise elimination circuit.

The delay time D2 adjusts a timing so as to prevent simultaneous changes in the output signal of the inverter 14 at the node E and the output signal PG of the delay buffer 15 to cause malfunction. The delay time D3 adjusts a timing so as to prevent simultaneous changes in the output signal of the inverter 14 at the node E and the output signal NG of the delay buffer 16 to cause malfunction. If the delay time of the delay buffers 15 and 16 are larger enough than the delay time of the inverter 14, these delay buffers can be eliminated. It is necessary to set the delay times D2 and D3 to be less than Ta, which is one-half of the minimum period T minus twice the delay time D1.

If at least one of the PMOS transistors P17 and P18 is nonconductive, and at least one of the NMOS transistors N19 and N20 is also nonconductive, the output from the logic circuit 10 to the node F is in the high impedance state. Further, if the enable signal EN is "H" and the node F is in the high impedance state, the state remains the same by the latch circuit 20 including the NAND gate 21 and the inverter 23.

The time period T1 is the state where the input signal IN and the enable signal EN are both "L" and each node is stabilized. In the followings, the circuit operation is explained about the case where no noise occurs immediately after the switching, which is from T1 to T6, and the case where noise occurs immediately after a change in the logic level of the input signal IN, which is from T7 to T13.

The circuit operation where no noise occurs immediately after a change in the logic level of the input signal IN in the time period between T1 and T6 is as follows.

Since the input signal IN and the enable signal EN are "L" and the voltage at each node is stable in T1, the output signal of the delay buffer 11 at the node B is "L", and the output signal of the inverter 14 at the node E is "H". The output signal at the node C of the OR gate 12 where "L" and "L" are inputted is "L", and the output signal at the node D of the AND gate 13 where "L" and "L" are inputted is "L". The output signal PG of the delay buffer 15 where the signal "L" at the node C is inputted and the output signal NG of the delay buffer 16 where the signal "L" at the node D is inputted are both "L". Consequently, the PMOS transistor P18 and the NMOS transistor N20 both turn off, and the output of the logic circuit 10 at the node F is in the high impedance state. If the enable signal EN is L", the output signal of the NAND gate 21 at the node G is "H" in each case where the node F is "L", "H", and in the high impedance state. Thus, when the enable signal EN is "L", the output signal OUT becomes "L" through the inverter 22.

In T2, the input signal IN is "L", and the node F remains in the high impedance state as in T1. When the enable signal EN becomes "H", the output signal of the NAND gate 21 at the node G is kept "H", which is the same state as when the enable signal EN is "L", by the latch circuit 20 including the NAND gate 21 and the inverter 23. Thus, even after the enable signal EN becomes "H", the previous state is maintained by the latch circuit 20, and the output signal OUT thereby stays "L".

The time period T3 equals the delay time D1 of the delay buffer 11. In T3, the input signal IN is "H", the output signal of the inverter 14 at the node E becomes "L", and the output signal of the delay buffer 11 at the node B is "L". The output signal at the node C of the OR gate 12 where "H" and "L" are inputted becomes "H", and the output signal at the node D of the AND gate 13 where "H" and "L" are inputted is "L". The output signal PG of the delay buffer 15 changes from "L" to "H" during T3 since the signal of the node C is outputted with the delay of the delay time D2. The output signal NG of the delay buffer 16 is "L" since the signal of the node D is outputted with the delay of the delay time D3. Hence, when the output signal PG of the delay buffer 15 is "L", the internal node F is "H", and the output signal OUT becomes "H" through the NAND gate 21 and the inverter 22. When the signal PG becomes "H", the PMOS transistor P17 and the NMOS transistor N20 both turn off, and the output of the logic circuit 10 at the node F becomes in the high impedance state, but the output signal OUT of the inverter 22 is kept "H", which is the same as when the signal PG is "L" by the latch circuit 20 including the NAND gate 21 and the inverter 23. Thus, the "H" level of the input signal IN is transmitted to the output signal OUT as it is without passing through the delay circuit.

In T4, the input signal IN is "H", the output signal of the inverter 14 at the node E is "L", and the output signal of the delay buffer 11 at the node B is "H". The output signal at the node C of the OR gate 12 where "H" and "H" are inputted is "H". The output signal at the node D of the AND gate 13 where "H" and "H" are inputted is "H". The output signal PG of the delay buffer 15 is "H" since the signal of the node C is outputted with the delay of the delay time D2, and the output signal NG of the delay buffer 16 changes from "L" to "H" during T4 since the signal of the node D is outputted with the delay of the delay time D3. Since the node E is "L" and the signal PG is "H", the PMOS transistor P17 and the NMOS transistor N19 turn off. Though the output of the logic circuit 10 at the node F thereby becomes in the high impedance state when the signal NG is either "L" or "H", the output signal OUT of the inverter 22 is kept "H", which is the same as in T3, by the latch circuit 20 including the NAND gate 21 and the inverter 23.

In T5, the input signal IN becomes "L", the output signal of the inverter 14 at the node E becomes "H", and the output signal of the delay buffer 11 at the node B is "H". The output signal at the node C of the OR gate 12 where "L" and "H" are inputted is "H", and the output signal at the node D of the AND gate 13 where "L" and "H" are inputted becomes "L". The output signal PG of the delay buffer 15 is "H" since the signal of the node C is outputted with the delay time of the delay time D2, and the output signal NG of the delay buffer 16 changes from "H" to "L" during T5 since the signal of the node D is outputted with the delay of the delay time D3. When the signal NG is "H", the node F is "L", and the output signal OUT is "L" through the NAND gate 21 and the inverter 22. On the other hand, when the signal NG is "L", the PMOS transistor P17 and the NMOS transistor N20 turn off, and the output of the logic circuit 10 at the node F becomes in the high impedance state. However, by the latch circuit 20 including the NAND gate 21 and the inverter 23, the output signal OUT of the inverter 22 is kept "L", which is the same as when the node NG is "H" during the delay time D3. Thus, the "L" level of the input signal IN is transmitted to the output signal OUT as it is without passing through the delay circuit.

In T6, the input signal IN is "L". The output signal of the inverter 14 at the node E is "H", and, the output signal of the delay buffer 11 at the node B is "L". The output signal at the node C of the OR gate 12 where "L" and "L" are inputted is "L", and the output signal at the node D of the AND gate 13 where "L" and "L" are inputted is "L". The output signal PG of the delay buffer 15 changes from "H" to "L" during T6 since the signal of the node C is outputted with the delay of the delay time D2. The output signal NG of the delay buffer 16 is "L" since the signal of the node D is outputted with the delay of the delay time D3. Since the node E is "H" and the signal NG is "L", the PMOS transistor P18 and the NMOS transistor N20 turn off. The output of the logic circuit 10 at the internal node F is thereby in the high impedance state when the signal PG is either "H" or "L"; however, the output signal OUT of the inverter 22 is kept "L" as in T5 by the latch circuit 20 including the NAND gate 21 and the inverter 23.

On the other hand, the circuit operation in the case where noise occurs immediately after the switching in the time period between T7 and T13 is as follows. The shaded part in FIG. 2 is a noise region where the logic level of the input signal IN is indeterminate due to noise. The waveform of the input signal IN is the same as that from T3 to T6. The signal whose logic level is indicated as "H" or "L" is a signal which is not in the noise region and thus has no noise.

In T7, the input signal IN is in the noise region. The output signal of the inverter 14 at the node E is also in the noise region, and the output signal of the delay buffer 11 at the node B is "L". The output signal at the node C of the OR gate 12 where the noise level and "L" are inputted becomes the noise region. The output signal at the node D of the AND gate 13 where the noise level and "L" are inputted is "L". The output signal NG of the delay buffer 16 is "L" since the signal of the node D is outputted with the delay of the delay time D3. If the signal NG is "L", the output of the logic circuit 10 at the node F is "H" or in the high impedance state regardless of the states of the signal of the node E and the signal PG. When the node F is "H", the output signal OUT of the inverter 22 is "H". When, on the other hand, the node F is in the high impedance state, the output signal OUT is kept "H" by the latch circuit 20 including the NAND gate 21 and the inverter 23. Thus, in T7, the noise is eliminated by transmitting only "H", the original level of the input signal IN, to the output, or by blocking the signal transmission from the input to the output.

In T8, the input signal IN is "H". The output signal of the inverter 14 at the node E becomes "L", and the output signal of the delay buffer 11 at the node B becomes in the noise region due to the noise in T7. The output signal at the node C of the OR gate 12 where "H" and the noise level are inputted becomes "H", and the output signal at the node D of the AND gate 13 where "H" and the noise level are inputted becomes in the noise region. The output signal PG of the delay buffer 15 changes from the noise region to "H" since the signal of the node C is outputted with the delay of the delay time D2. The output signal NG of the delay buffer 16 changes from "L" to the noise region since the signal of the node D is outputted with the delay of the delay time D3. If the node E is "L", the output of the logic circuit 10 at the node F becomes "H" or in the high impedance state regardless of the states of the signal PG and the signal NG. When the node F is "H", the output signal OUT of the inverter 22 is "H". When the node F is in the high impedance state, the output signal OUT is kept "H" by the latch circuit 20 including the NAND gate 21 and the inverter 23. Thus, in T8 as well, the noise is eliminated by transmitting only "H", the original level of the input signal IN, to the output, or by blocking the signal transmission from the input to the output.

In T9, the input signal IN is "H". The output signal of the inverter 14 at the node E is "L", and the output signal of the delay buffer 11 at the node B is "H". The output signal at the node C of the OR gate 12 where "H" and "H" are inputted is "H", and the output signal at the node D of the AND gate 13 where "H" and "H" are inputted is "H". The output signal PG of the delay buffer 15 is "H" since the signal of the node C is outputted with the delay of the delay time D2. The output signal NG of the delay buffer 16 changes from the noise region to "H" since the signal of the node D is outputted with the delay of the delay time D3. If the signal of the node E is "L" and the signal PG is "H", the output of the logic circuit 10 at the node F is in the high impedance state regardless of the state of the output signal NG of the delay buffer 16. When it is in the high impedance state, the output signal OUT is kept "H" since the output signal OUT of T8 is retained by the latch circuit 20 including the NAND gate 21 and the inverter 23. Thus, in T9, the noise is eliminated by blocking the signal transmission from the input to the output.

At P1, the input signal IN changes from "H" to "L", and the output signal of the inverter 14 at the node E changes from "L" to "H". The output signal of the delay buffer 11 at the node B is "H". The output signal at the node C of the OR gate 12 where the signal changing from "H" to "L" and "H" are inputted is "H". The output signal at the node D of the AND gate 13 where the signal changing from "H" to "L" and "H" are inputted changes form "H" to "L". The output signal PG of the delay buffer 15 is "H" since the signal of the node C is outputted with the delay of the delay time D2. The output signal NG of the delay buffer 16 is also "H" since the signal of the node D is outputted with the delay of the delay time D3. Hence, due to the change in the input signal IN from "H" to "L", the output of logic circuit 10 at the node F changes from the high impedance state to "L", and the output signal OUT changes form "H" to "L". Thus, the change in the input signal IN form "H" to "L" is transmitted to the output signal OUT as it is without passing through the delay circuit.

In T10, the input signal IN is in the noise region, the output signal of the inverter 14 at the node E is in the noise region, and the output signal of the delay buffer 11 at the node B is "H". The output signal at the node C of the OR gate 12 where the noise level and "H" are inputted is "H", and the output signal at the node D of the AND gate 13 where the noise level and "H" are inputted becomes in the noise region. The output signal PG of the delay buffer 15 is "H" since the signal of the node C is outputted with the delay of the delay time D2. The output signal NG of the delay buffer 16 changes form "H" to the noise region since the signal of the node D is outputted with the delay of the delay time D3. If the signal PG is "H", the output of logic circuit 10 at the node F is "L" or in the high impedance state regardless of the states of the signal of the node E and the signal NG. When the node F is "L", the output signal OUT of the inverter 22 is "L". When the node F is in the high impedance state, the output signal OUT is kept "L" by the latch circuit 20 including the NAND gate 21 and the inverter 23. Thus, in T10, the noise is eliminated by transmitting only "L", the original level of the input signal IN, to the output, or by blocking the signal transmission from the input to the output.

In T11, the input signal IN is "L", the output signal of the inverter 14 at the node E is "H", and the output signal of the delay buffer 11 at the node B is in the noise region. The output signal at the node C of the OR gate 12 where "H" and the noise level are inputted becomes in the noise region, and the output signal at the node D of the AND gate 13 where "H" and the noise level are inputted becomes "L". The output signal PG of the delay buffer 15 changes from "H" to the noise region sine the signal of the node C is outputted with the delay of the delay time D2. The output signal NG of the delay buffer 16 changes from the noise region to "L" since the signal of the node D is outputted with the delay of the delay time D3. If the node E is "H", the output of logic circuit 10 at the node F is "L" or in the high impedance state regardless of the states of the signal PG and the signal NG. When the node F is "L", the output signal OUT of inverter 22 is "L". When, on the other hand, the node F is in the high impedance state, the output signal OUT is kept "L"

by the latch circuit 20 including the NAND gate 21 and the inverter 23. Thus, in T11 as well, the noise is eliminated by transmitting only "L", the original level of the input signal IN, to the output, or by blocking the signal transmission from the input to the output.

In T12, the input signal IN is "L", the output signal of the inverter 14 at the node E is "H", and the output signal of the delay buffer 11 at the node B is "L". The output signal at the node C of the OR gate 12 where "L" and "L" are inputted is "L", and the output signal node D) of the AND gate 13 where "L" and "L" are inputted is also "L". The output signal PG of the delay buffer 15 changes from noise region to "L" since the signal of the node C is outputted with the delay of the delay time D2. The output signal NG of the delay buffer 16 is "L" since the signal of the node D is outputted with the delay of the delay time D3. If the node E is "H" and the signal NG is "L", the output of logic circuit 10 at the node F is in the high impedance state regardless of the state of the signal PG. When it is in the high impedance state, the output signal OUT is kept "L" since the output signal OUT of T1 is retained by the latch circuit 20 including the NAND gate 21 and the inverter 23. Thus, in T12, the noise is eliminated by blocking the signal transmission from the input to the output.

At P2, the input signal IN changes from "L" to "H", and the output signal of the inverter 14 at the node E changes from "H" to "L". The output signal of the delay buffer 11 at the node B is "L". The output signal at the node C of the OR gate 12 where the signal changing from "L" to "H" and "L" are inputted changes from "L" to "H". The output signal at the node D of the AND gate 13 where the signal changing from "L" to "H" and "H" are inputted becomes "L". The output signal PG of the delay buffer 15 is "L" since the signal of the node C is outputted with the delay of the delay time D2. The output signal NG of the delay buffer 16 is "L" since the signal of the node is outputted with the delay of the delay time D3. Hence, with the change in the input signal IN from "L" to "H", the output of logic circuit 10 at the node F changes from the high impedance state to "H", and the output signal OUT changes form "L" to "H". Thus, the change in the input signal IN from "L" to "H" is transmitted to the output signal OUT as it is without passing through the delay circuit.

In T13, the input signal IN is in the noise region. The output signal of the inverter 14 at the node E is also in the noise region. The output signal of the delay buffer 11 at the node B is "L". The output signal at the node C of the OR gate 12 where the noise level and "L" are inputted becomes in the noise region, and the output signal at the node D of the AND gate 13 where the noise level and "L" are inputted is "L". The output signal NG of the delay buffer 16 is "L" since the signal of the node D is outputted with the delay of the delay time D3. If the signal NG is "L", the output of logic circuit 10 at the node F is "H" or in the high impedance state regardless of the states of the signal of the node E and the signal PG. When the node F is "H", the output signal OUT of the inverter 22 is "H". When, on the other hand, the node F is in the high impedance state, the output signal OUT is kept "H" by the latch circuit 20 including the NAND gate 21 and the inverter 23. Thus, in T13 as well, the noise is eliminated by transmitting only "H", the original level of the input signal IN, to the output, or by blocking the signal transmission from the input to the output.

Figure 3:
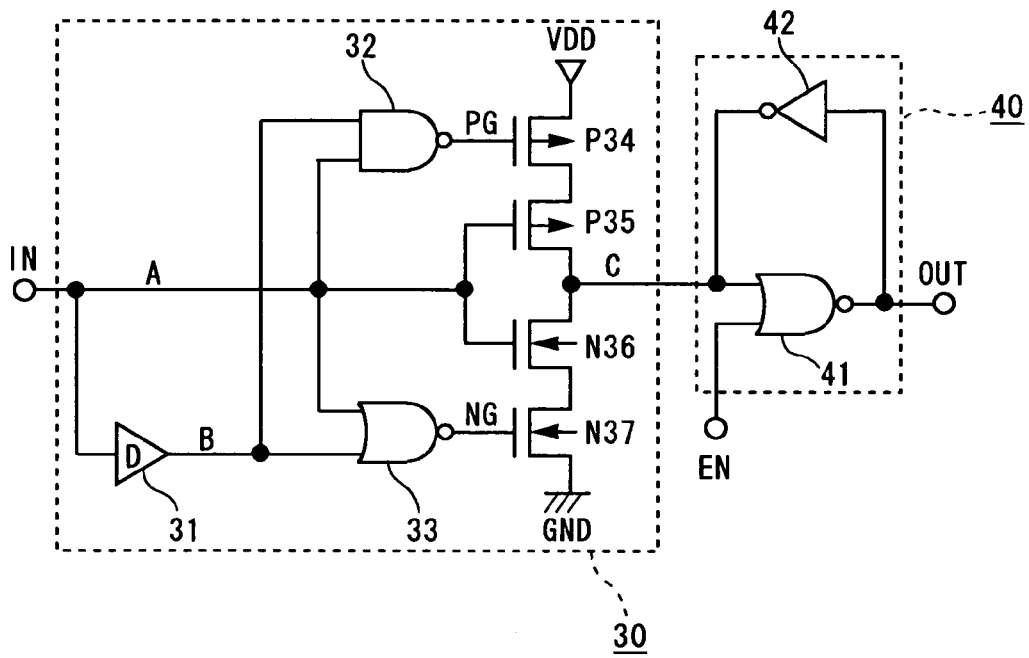
FIG. 3 is a circuit diagram showing the configuration of a noise elimination circuit of another embodiment of the invention.

Another embodiment of the invention is explained hereinafter with reference to the drawings. FIG. 3 is a circuit diagram showing the configuration of a noise elimination circuit of a second embodiment. The noise elimination circuit of the second embodiment includes a logic circuit 30 and a latch circuit 40. The logic circuit 30 includes a delay buffer 31, a NAND gate 32, a NOR gate 33, a PMOS transistor P34, a PMOS transistor P35, a NMOS transistor N36, and a NMOS transistor N37. The latch circuit 40 includes a NOR gate 41 and an inverter 42.

The first input of the NAND gate 32 is connected to a node A to receive an input signal IN. The second input of the NAND gate 32 is connected to a node B, which is the output of the delay buffer 31, to receive an output signal from the delay buffer 31. Similarly, the first input of the NOR gate 33 is connected to the node A, and the second input is connected to the node B. The input of the delay buffer 31 is connected to the node A to receive the input signal IN.

The gate electrodes of the PMOS transistor P35 and the NMOS transistor N36 are both connected to the node A to receive the input signal IN. The gate electrode of the PMOS transistor P34 is connected to the output of the NAND gate 32 to receive an output signal PG from the NAND gate 32. The gate electrode of the NMOS transistor N37 is connected to the output of the NOR gate 33 to receive an output signal NG from the NOR gate 33. The source electrode of the PMOS transistor P34 is connected to a first power supply (VDD). The source electrode of the NMOS transistor N37 is connected to a second power supply (GND). The drain electrode of the PMOS transistor P34 is connected to the source electrode of the PMOS transistor P35.

The drain electrode of the NMOS transistor N37 is connected to the source electrode of the NMOS transistor N36. The drain electrodes of the PMOS transistor P35 and the NMOS transistor N36 and the output of the inverter 42 are connected to the output of the logic circuit 30 at the node C. The first input of the NOR gate 41 is connected to the node C, and the second input receives an enable signal EN. The input of the inverter 42 is connected to the output of the NOR gate 41. An output signal OUT of the noise elimination circuit is outputted from the NOR gate 41.

Figure 4:
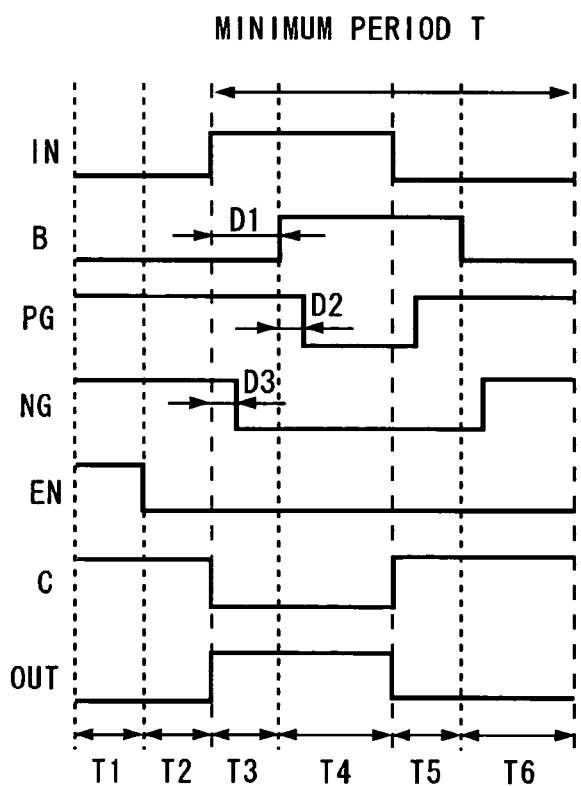
FIG. 4 is a timing chart to explain the operation of the noise elimination circuit of FIG. 3.

Referring next to FIG. 4, the operation of the noise elimination circuit of the second embodiment is explained. In FIG. 4, D1, D2, and D3 indicate delay times of the delay buffer 31, the NAND gate 32, and the NOR gate 33, respectively. The input signal IN is the same as that in FIG. 2. An initial value is set in the time period T1. If the enable signal EN is "H", the output signal OUT is "L" regardless of the voltage at the node C.

In T2, when the enable signal EN becomes "L", the noise elimination circuit starts operating. The input signal IN in T2 is "L", and the output signal of the delay buffer 31 at the node B is also "L". The output signal PG of the NAND gate 32 where "L" and "L" are inputted is "H". The output signal NG of the NOR gate 33 where "L" and "L" are inputted is also "H". Though the output of the logic circuit 30 at the node C thereby becomes in the high impedance state, the output signal OUT is kept "L" as in T1 by the latch circuit 40.

The time period T3 in FIG. 4 corresponds to the time periods T3 and T7 in FIG. 2. If the input signal IN changes from "L" to "H" at the start of T3, the input signal IN in T3 becomes in the noise region. Since the output of the delay buffer 31 is outputted with the delay of the delay time D1, the output of the delay buffer at the node B is "L". The output signal PG of the NAND gate 32 where "H" and "L" are inputted is "H". Though the output of the NOR gate 33 where "H" and "L" are inputted is "L", the output signal NG changes from "H" to "L" during T3 since the signal is outputted with the delay of the delay time D3. Thus, the output signal NG of the NOR gate 33 changes form "H" to the noise region during T3. The signal PG in T3 is "H". The output of the logic circuit 30 at the node C is "L" or in the high impedance state regardless of the states of the voltages of the input signal IN and the signal NG. The signal NG is "H" at the start of T3, and the voltage at the node C becomes "L" due to a change in the input signal IN from "L" to "H", without being affected by the delay buffer 31. When the voltage at the node C is "L", the output signal OUT of the NOR gate 41 in the latch circuit 40 is "H". When, on the other hand, it is in the high impedance state, the output signal OUT is kept "H" by the latch circuit 40. Thus, in T3, the noise is eliminated by transmitting only "H", the original level of the input signal IN, to the output, or by blocking the signal transmission from the input to the output.

The time period T4 in FIG. 4 corresponds to the time periods T4 and T8 plus T9 in FIG. 2. The input signal IN in T4 is "H", and the output of the delay buffer 31 at the node B stays in the noise region for the period of D1 and then changes to "H". The output signal PG of the NAND gate 32 where "H" and the output of the delay buffer 31 are inputted stays "H " for the period of D2, becomes in the noise region for D1, and then changes to "L" since it is outputted with the delay of the delay time D2. The output signal NG of the NOR gate 33 where "H" and the output of the delay buffer 31 are inputted stays in the noise region for the period of the sum of D3 and D1 and then changes to "L" since it is outputted with the delay time of D3. If the input signal IN is "H", the output of the logic circuit 30 at the node C is "L" or in the high impedance state regardless of the states of the signal PG and the signal NG. When the output of the logic circuit 30 at the node C is "L", the output signal OUT is "H". When it is in the high impedance state, the output signal OUT is kept "H" by the latch circuit 40. Thus, in T4 as well, the noise is eliminated by transmitting only "H", the original level of the input signal IN, to the output, or by blocking the signal transmission from the input to the output.

The time period T5 in FIG. 4 corresponds to the time periods T5 and T10 in FIG. 2. In T5, the input signal IN is in the noise region, and the output of delay buffer 31 at the node B is "H". The output signal PG of the NAND gate 32 where "H" and the noise level are inputted changes from "L" to the noise region since it is outputted with the delay of D2. The output signal NG of the NOR gate 33 where "H" and the noise level are inputted is "L". If the output signal NG of the NOR gate 33 is "L", the output of the logic circuit 30 at the node C is "H" or in the high impedance state regardless of the states of the input signal IN and the signal PG. When the output of the logic circuit 30 at the node C is "H", the output signal OUT is "L". When, on the other hand, it is in the high impedance state, the output signal OUT is kept "L" by the latch circuit 40. Thus, in T5 as well, the noise is eliminated by transmitting only "L", the original level of the input signal IN, to the output, or by blocking the signal transmission from the input to the output. Since the signal PG is "L" at the start of T5, a change in the input signal IN from "H" to "L" at the start of T5 is transmitted to the output as it is without being affected by the delay buffer 31.

The time period T6 in FIG. 4 corresponds to the time periods T6 and T11 plus T12 in FIG. 2. In T6, the input signal is "L", and the output of the delay buffer 31 at the node B stays the noise region for the period of D1 and then changes to "L". The output signal PG of the NAND gate 32 where "L" and the output of the delay buffer 31 are inputted stays in the noise region for the period of D2 and then changes to "H" since it is outputted with the delay of D2. The output signal NG of the NOR gate 33 where "L" and the delay buffer 31 are outputted stays "L" for the period of D3 and then becomes in the noise region since it is outputted with the delay of D3. If the input signal IN is "L", the output of the logic circuit 30 at the node C is "H" or in the high impedance state regardless of the states of the signal PG and the signal NG. When the output of the logic circuit 30 at the node C is "H", the output signal OUT is "L". When, on the other hand, it is in the high impedance state, the output signal OUT is kept "L" by the latch circuit 40. Thus, in T6 as well, the noise is eliminated by transmitting only "L", the original level of the input signal IN, to the output, or by blocking the signal transmission from the input to the output.

Figure 5:
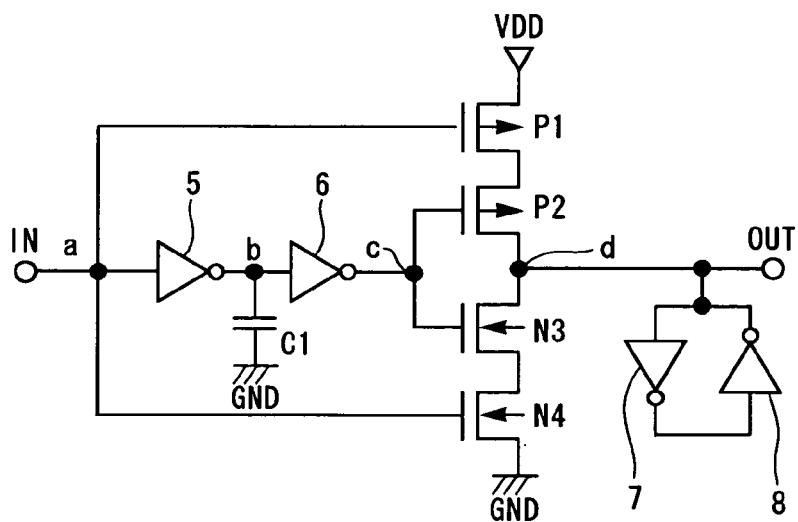
FIG. 5 is a circuit diagram showing the configuration of a noise elimination circuit of a related art.
Figure 6:
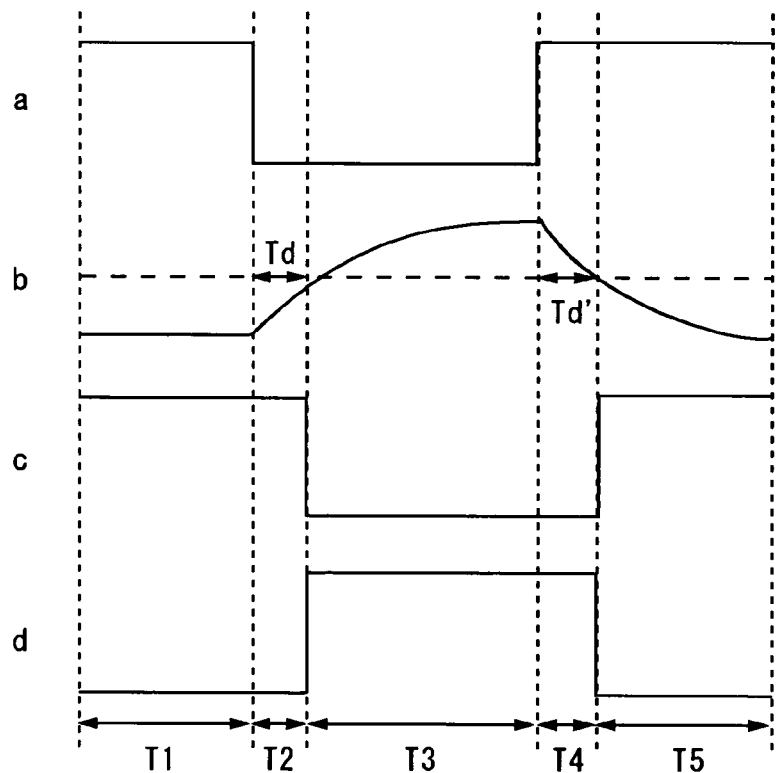
FIG. 6 is a timing chart to explain the operation of the noise elimination circuit of FIG. 5.

Preferred embodiments of the present invention are explained above. The invention, however, is not limited to these embodiments. For example, the latch circuit may include inverters instead of the NAND gate 21 and the NOR gate 41. In this case, it is necessary to input a pulse for setting an initial value to the input of the noise elimination circuit. Alternatively, the latch circuit may have the configuration shown in FIG. 5. Further, in the first embodiment, the output of the inverter 14 may be inputted to the PMOS transistor P17 and the NMOS transistor N20, and the signal PG and the signal NG may be inputted to the PMOS transistor P18 and the NMOS transistor N19, respectively. This is the same for the second embodiment. Furthermore, in the second embodiment, a delay buffer may be inserted between the NAND gate 32 and the PMOS transistor P34, and between the NOR gate 33 and the NMOS transistor N37.

It is apparent that the present invention is not limited to the above embodiment, but may be modified and changed without departing from the scope and spirit of the invention.

What is claimed is:

1. A noise elimination circuit comprising:
   a logic circuit comprising
      a first transistor outputting a first logic level to an output node in response to a first direction change in a logic level of an input signal, with substantially no time delay;
      a second transistor outputting a second logic level to the output node in response to a second direction change in the logic level of the input signal, with substantially no time delay;
      a third transistor connected in series to the second transistor and blocking signal output from the second transistor to the output node for a certain period of time after the second direction change in the logic level of the input signal; and
      a fourth transistor connected in series to the first transistor and blocking signal output from the first transistor to the output node for a certain period of time after the first direction change in the logic level of the input signal; and
   a latch circuit keeping a signal of the output node.

2. The noise elimination circuit according to claim 1, wherein the latch circuit includes an enable signal input to set an initial value of an output.

3. The noise elimination circuit according to claim 1, further comprising:
   a first logic gate receiving the input signal and an output of a first delay circuit delaying the input signal for the certain period of time; and
   a second logic gate receiving the input signal and the output of the first delay circuit,
   wherein the third transistor blocks signal output from the second transistor to the output node in response to an output of the first logic gate, and the fourth transistor blocks signal output from the first transistor to the output node in response to an output of the second logic gate.

4. The noise elimination circuit according to claim 3, further comprising:
a second delay circuit delaying an output of the first logic gate; and
a third delay circuit delaying an output of the second logic gate.

5. The noise elimination circuit according to claim 4, wherein a delay time determined by the second delay circuit and a delay time determined by the third delay circuit are less than a value of one-half of a minimum period of the input signal minus a value of twice a delay time determined by the first delay circuit.

6. The noise elimination circuit according to claim 3, wherein the first and fourth transistors comprise PMOS transistors connected in series between a first power supply and the output node, the second and third transistors comprise NMOS, transistors connected between the output node and a second power supply, the first logic gate comprises an AND gate, and the second logic gate comprises an OR gate.

7. The noise elimination circuit according to claim 6, further comprising:
a second delay circuit connected between an output of the AND gate and a gate electrode of the third transistor; and
a third delay circuit connected between an output of the OR gate and a gate electrode of the fourth transistor.

8. The noise elimination circuit according to claim 6, wherein gate electrodes of the first and second transistors receive an inverted signal of the input signal.

9. The noise elimination circuit according to claim 3, wherein the first and fourth transistors comprise PMOS transistors connected in series between a first power supply and the output node, the second and third transistor comprise NMOS transistors connected between the output node and a second power supply, the first logic gate comprises a NOR gate, and the second logic gate comprises a NAND gate.

10. The noise elimination circuit according to claim 3, wherein a delay time determined by the first delay circuit is less than a value of one-fourth of a minimum period of the input signal.

11. A noise elimination circuit comprising:
a logic circuit comprising
first and second MOS transistors of a first conductivity type connected in series between a first power supply and an output node;
first and second MOS transistors of a second conductivity type connected in series between the output node and a second power supply;
a delay circuit delaying an input signal for a certain period of time; and
first and second logic gates receiving the input signal and an output signal of the delay circuit; and
a latch circuit keeping a signal of the output node,
wherein the second MOS transistor of the first conductivity type becomes conductive in response to the input signal and outputs a first logic level to the output node with substantially no time delay, the first MOS transistor of the second conductivity type becomes conductive in response to the input signal and outputs a second logic level to the output node with substantially no time delay, the second MOS transistor of the second conductivity type becomes nonconductive in response to an output signal of the second logic gate for a certain period of time after the second MOS transistor of the first conductivity type becomes conductive, and the first MOS transistor of the first conductivity type becomes nonconductive in response to an output signal of the first logic gate for a certain period of time after the first MOS transistor of the second conductivity type becomes conductive.

12. The noise elimination circuit according to claim 11, wherein the first and second MOS transistors of the first conductivity type comprise PMOS transistors, the first and second MOS transistor of the second conductivity type comprise NMOS transistors, the first logic gate comprises an OR gate, and the second logic gate comprises an AND gate.

13. The noise elimination circuit according to claim 12, further comprising:
a delay circuit between an output of the OR gate and a gate electrode of the first MOS transistor of the first conductivity type; and
a delay circuit between an output of the AND gate and a gate electrode of the second MOS transistor of the second conductivity type.

14. The noise elimination circuit according to claim 11, further comprising:
an inverter having an output connected to a gate electrode of the second MOS transistor of the first conductivity type and a gate electrode of the first MOS transistor of the second conductivity type, and an input receiving the input signal.

15. The noise elimination circuit according to claim 11, wherein the first logic gate comprises a NAND gate, and the second logic gate comprises a NOR gate.

16. A noise elimination circuit, comprising:
an input node;
an output node;
a time delay element having an input connected to said input node;
first and second MOS transistors of a first conductivity type connected in series between a first power supply node and said output node;
third and fourth MOS transistors of a second conductivity type connected in series between said output node and a second power supply node;
an AND-based logic gate having a first input connected to said input node, a second input connected to an output of said time delay element, and an output controlling said first MOS transistor; and
an OR-based logic gate having a first input connected to said input node, a second input connected to said output of said time delay element, and an output controlling said fourth MOS transistor.

17. The noise elimination circuit of claim 16, wherein said input node is directly connected to gates of said second and third MOS transistors, said AND-based logic gate comprises a NAND gate, and said OR-based logic gate comprises a NOR gate.

18. The noise elimination circuit of claim 16, further comprising:
an inverter having an input connected to said input node and an output connected to gates of said second and third MOS transistors, said AND-based logic gate comprises an AND gate, and said OR-based logic gate comprises an OR gate;
a second time delay having an input connected to an output of said AND gate and an output connected to a gate of said first MOS transistor; and
a third time delay having an input connected to an output of said OR gate and an output connected to a gate of said fourth MOS transistor.

19. The noise elimination circuit of claim 16, further comprising a latch keeping a signal of the output node.

20. The noise elimination circuit of claim 19, wherein said latch includes an ENABLE input.

21. The noise elimination circuit of claim 19, further comprising an inverter having an input connected to an output of said latch.

* * * * *